(12) United States Patent
Okada et al.

(10) Patent No.: US 9,034,735 B2
(45) Date of Patent: May 19, 2015

(54) LASER PROCESSING METHOD FOR WORKPIECE

(71) Applicant: Disco Corporation, Tokyo (JP)

(72) Inventors: Shigefumi Okada, Tokyo (JP); Nobumori Ogoshi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/048,369

(22) Filed: Oct. 8, 2013

(65) Prior Publication Data

US 2014/0106545 A1    Apr. 17, 2014

(30) Foreign Application Priority Data

Oct. 16, 2012  (JP) .................................. 2012-228807

(51) Int. Cl.
| | |
|---|---|
| H01L 21/78 | (2006.01) |
| B23K 26/40 | (2014.01) |
| B23K 26/00 | (2014.01) |
| B23K 26/04 | (2014.01) |
| B23K 26/10 | (2006.01) |

(52) U.S. Cl.
CPC ............ *H01L 21/78* (2013.01); *B23K 26/4075* (2013.01); *B23K 26/0057* (2013.01); *B23K 26/045* (2013.01); *B23K 26/10* (2013.01)

(58) Field of Classification Search
CPC ........................................... H01L 21/78–21/86
USPC ................................. 219/121.169; 438/7, 463
See application file for complete search history.

(56) References Cited

U.S. PATENT DOCUMENTS

| | | | |
|---|---|---|---|
| 6,399,463 B1 * | 6/2002 | Glenn et al. .................. | 438/463 |
| 6,992,026 B2 * | 1/2006 | Fukuyo et al. ................ | 438/797 |
| 2009/0314751 A1 * | 12/2009 | Manens et al. ........... | 219/121.69 |

FOREIGN PATENT DOCUMENTS

JP         2002-192370         7/2002

* cited by examiner

*Primary Examiner* — Daniel Shook
(74) *Attorney, Agent, or Firm* — Greer Burns & Crain, Ltd.

(57) ABSTRACT

During the performance of a laser processing step of applying a laser beam to a wafer to form modified layers inside the wafer respectively along division lines, a predetermined one of the modified layers already formed is imaged by a camera from the back side of the wafer with predetermined timing, and a positional deviation of the predetermined modified layer from the corresponding division line is detected to calculate a correction value. Then, the correction value is added to data on applied position of the laser beam to thereby make the applied position of the laser beam coincide with each division line. Accordingly, a positional deviation of the modified layer to be formed after this correction from each division line can be suppressed.

9 Claims, 10 Drawing Sheets

LASER PROCESSING METHOD FOR WORKPIECE

BACKGROUND OF THE INVENTION

1. Field of the Invention

The present invention relates to a laser processing method of applying a laser beam to the inside of a thin platelike workpiece such as a semiconductor wafer from the back side thereof, thereby performing laser processing to the workpiece.

2. Description of the Related Art

In a semiconductor device fabrication process, a plurality of devices having electronic circuits are formed on the front side of a semiconductor wafer in a plurality of regions partitioned by a plurality of crossing division lines (process lines). The semiconductor wafer thus having the plural devices is divided along the division lines to thereby obtain a plurality of individual semiconductor chips respectively corresponding to the plural devices. As a method of dividing a workpiece such as a semiconductor wafer, there is a method including the steps of applying a laser beam having a transmission wavelength to the workpiece along each division line in the condition where the focal point of the laser beam is set inside the workpiece, thereby forming a modified layer inside the workpiece along each division line, and next applying an external force to the workpiece to divide the workpiece from the each modified layer as a break start point (see Japanese Patent No. 3408805, for example).

SUMMARY OF THE INVENTION

In performing this kind of laser processing by using laser beam applying means such as a laser head unit, the components of the laser beam applying means may be expanded or contracted by temperature changes, causing a possibility that a laser applied position may be deviated from a target position. When the laser applied position is deviated, there is a possibility that the modified layer may be formed at a device formed position. In dividing the workpiece along this modified layer by applying an external force in the above case, there arises a problem such that the workpiece is not properly divided to produce odd-shaped chips or damage the devices.

It is therefore an object of the present invention to provide a laser processing method which can reduce the deviation of the laser applied position in applying a laser beam to the workpiece along each process line to perform laser processing to the workpiece.

In accordance with an aspect of the present invention, there is provided a laser processing method of performing laser processing to a workpiece having a plurality of devices respectively formed in a plurality of regions partitioned by a plurality of crossing process lines formed on the front side of the workpiece, the laser processing method including a holding step of holding the front side of the workpiece by using holding means to expose the back side of the workpiece; an alignment step of detecting the process lines from the back side of the workpiece held by the holding means to align each process line with a laser beam having a transmission wavelength to the workpiece; a laser processing step of applying the laser beam to the workpiece from the back side thereof along each process line in the condition where the focal point of the laser beam is set inside the workpiece after performing the alignment step, thereby forming a plurality of modified layers inside the workpiece respectively along the plurality of process lines; and a positional deviation correcting step of imaging a predetermined one of the modified layers formed inside the workpiece from the back side of the workpiece with predetermined timing by using imaging means during the performance of the laser processing step, detecting a positional deviation of the predetermined modified layer from the corresponding process line to calculate a correction value, and adding the correction value to data on applied position of the laser beam to thereby make the applied position of the laser beam coincide with each process line.

In the laser processing method of the present invention, the positional deviation correcting step is performed with predetermined timing during the performance of the laser processing step. That is, a positional deviation of a predetermined one of the modified layers already formed from the corresponding process line is detected to calculate a correction value according to the result of detection. Then, the correction value is added to data on applied position of the laser beam to make the applied position of the laser beam coincide with each process line after this correction. Accordingly, the deviation of the laser applied position can be reduced.

Preferably, each modified layer is formed at a predetermined height from the front side of the workpiece in the laser processing step; and the positional deviation correcting step includes the steps of applying the laser beam along the predetermined modified layer to thereby form a correcting modified layer near the back side of the workpiece at a level higher than the predetermined height, imaging the correcting modified layer by using the imaging means, and detecting a positional deviation of the correcting modified layer from the corresponding process line to calculate the correction value.

With this configuration, each correcting modified layer is formed as an index for detection of the positional deviation of each regular modified layer from the corresponding process line. Each correcting modified layer is formed at a vertical position near the back side of the workpiece above the corresponding regular modified layer. Accordingly, an image by electromagnetic waves reflected by each correcting modified layer can be obtained more clearly. As a result, the laser applied position can be aligned with each process line more accurately. Further, if each correcting modified layer is formed near the back side of the workpiece before forming the corresponding regular modified layer near the front side of the workpiece along the same process line, there is a possibility that the laser beam for forming the regular modified layer may be blocked by the correcting modified layer, so that the regular modified layer may not be formed. To the contrary, according to the present invention, the correcting modified layer is formed after forming the regular modified layer, so that the regular modified layer can be reliably formed.

Preferably, the correcting modified layer is locally formed so as to have a predetermined length along the corresponding process line. With this configuration, the correcting modified layer is locally formed, so that a reduction in strength of the workpiece can be suppressed.

Preferably, the predetermined height of each modified layer is greater than a finished thickness of the workpiece from the front side thereof; cracks are formed along each modified layer so as to extend from each modified layer to the front side of the workpiece; and the laser processing method further includes a grinding step of grinding the back side of the workpiece to reduce the thickness of the workpiece to the finished thickness after performing the laser processing step, thereby dividing the workpiece along each process line to obtain individual chips. By performing the grinding step, all of the correcting modified layers and all of the regular modified layers are removed, so that these modified layers are not left on each chip. As a result, the die strength of each chip can be improved as compared with the case where the modified layers are left on each chip.

According to the present invention, it is possible to provide a laser processing method which can reduce the deviation of the laser applied position in applying a laser beam to the workpiece along each process line to perform laser processing to the workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described with reference to the drawings.

(1) Wafer

Figure 1:
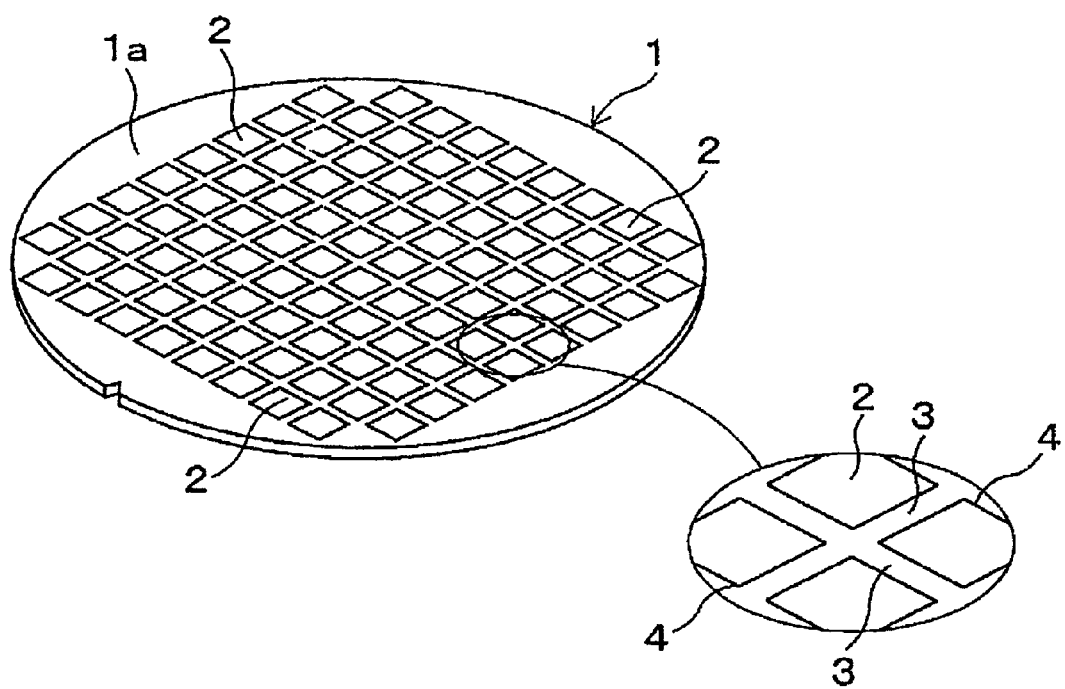
FIG. 1 is a perspective view of a wafer (workpiece) according to a preferred embodiment of the present invention.

FIG. 1 shows a wafer 1 such as a semiconductor wafer as a workpiece in this preferred embodiment. The wafer 1 is formed of silicon or the like and it is a disk-shaped member having a thickness of about 700 μm, for example. A plurality of devices 2 are formed on a front side 1a of the wafer 1. A plurality of crossing division lines 3 (process lines) extending in a first direction and a second direction perpendicular to the first direction are formed on the front side 1a of the wafer 1 to thereby partition a plurality of rectangular regions 4 where a plurality of electronic circuits such as LSIs are respectively formed, thus forming the plural devices 2. This preferred embodiment is a laser processing method including the steps of laser processing and grinding the wafer 1 to thereby divide the wafer 1 into a plurality of rectangular regions 4 to obtain chips respectively corresponding to the plural devices 2.

Figure 2:
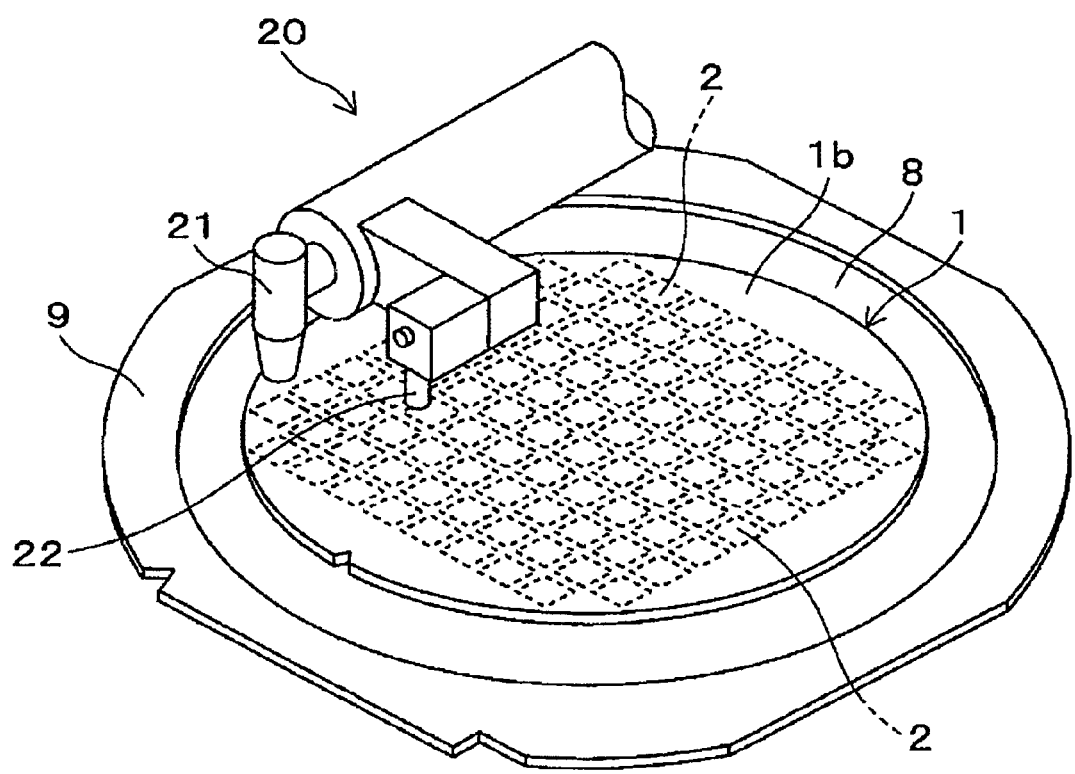
FIG. 2 is a perspective view showing a condition that the wafer is supported through an adhesive tape to an annular frame prior to performing a holding step in a laser processing method according to this preferred embodiment.

As shown in FIG. 2, the wafer 1 is supported through an adhesive tape 8 to an annular frame 9 prior to performing the laser processing method. The adhesive tape 8 is composed of an extensible base sheet and an adhesive layer formed on one side of the base sheet. The annular frame 9 is attached to the adhesive layer in a peripheral portion of the adhesive tape 8. The front side 1a of the wafer 1 is attached to the adhesive layer of the adhesive tape 8 in the condition where the wafer 1 is concentric with the circular inner circumference of the annular frame 9. Accordingly, the back side 1b of the wafer 1 attached to the adhesive tape 8 is exposed. The wafer 1 is transported by handling the annular frame 9. The laser processing method will now be described in the order of steps.

(2) Laser Processing Method (2-1) Holding Step

Figure 3:
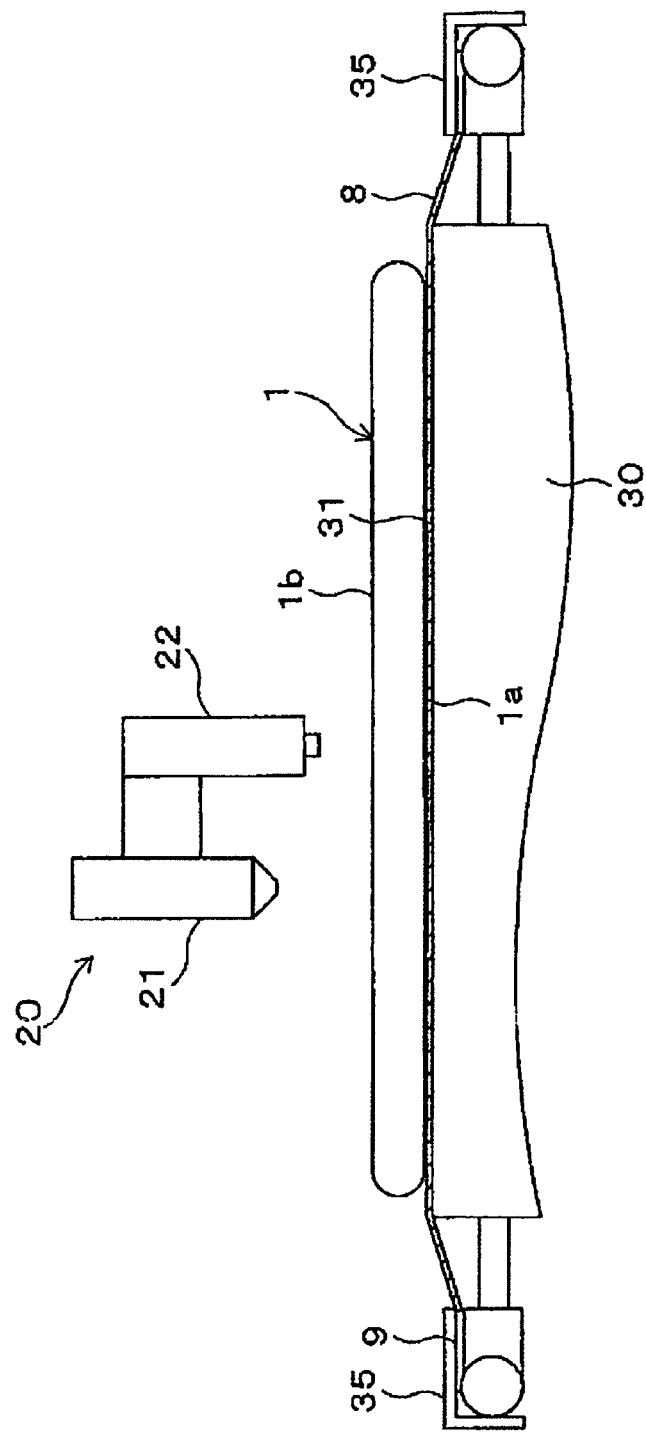
FIG. 3 is a partially sectional side view showing the holding step.
Figure 4:
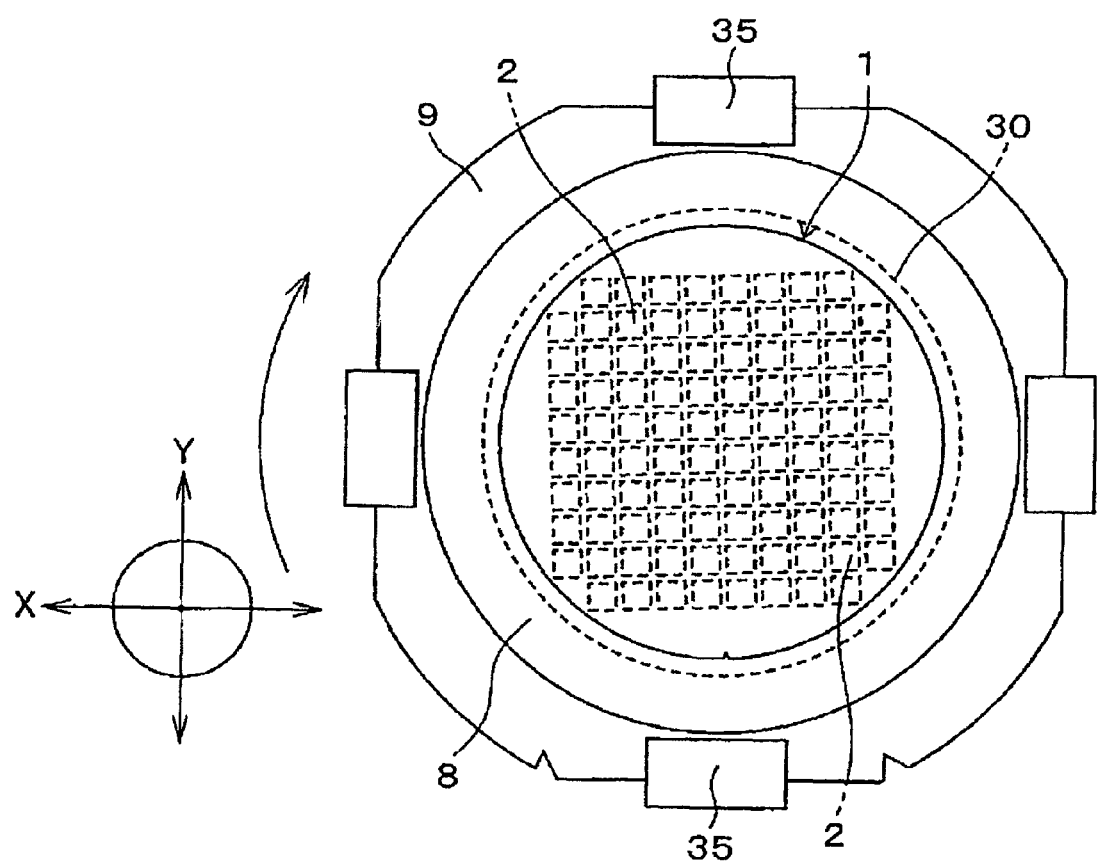
FIG. 4 is a plan view showing an alignment step in the laser processing method.

As shown in FIGS. 2 to 4, a holding step is performed in such a manner that the front side 1a of the wafer 1 is held through the adhesive tape 8 on holding means 30 and the back side 1b of the wafer 1 is exposed, wherein the holding means 30 is rotatable and laser processing means 20 is provided above the holding means 30. The holding means 30 has a horizontal circular upper surface as a holding surface 31 for holding the wafer 1 thereon under suction by a vacuum. The wafer 1 is concentrically placed on the holding surface 31 and then held thereon under suction. The annular frame 9 is fixed by a plurality of clamp mechanisms 35 provided around the holding means 30. As shown in FIG. 3, the annular frame 9 is fixed at a level lower than that of the holding surface 31, so that a certain degree of tension is applied to the adhesive tape 8.

The laser processing means 20 has a laser applying unit 21 for applying a laser beam to the wafer 1 and a microscope camera 22 (imaging means) fixed to the laser applying unit 21 for detecting the division lines 3 of the wafer 1. The wavelength of the laser beam to be applied from the laser applying unit 21 is transmissive to the wafer 1 and capable of forming a modified layer inside the wafer 1. The camera 22 can image the division lines 3 formed on the front side 1a of the wafer 1, and it is so designed as to apply electromagnetic waves (e.g., infrared radiation) having a transmission wavelength to the wafer 1. The laser processing means 20 and the holding means 30 are relatively movable in a feeding direction shown by an arrow X in FIG. 4 and in an indexing direction shown by an arrow Y in FIG. 4.

(2-2) Alignment Step

An alignment step is next performed in such a manner that the division lines 3 are detected from the back side 1b of the wafer 1 held by the holding means 30 to align each division line 3 with the laser beam to be applied from the laser applying unit 21. The camera 22 has a reference line coinciding with a scanning line of the laser beam. This reference line is set parallel to the feeding direction (X direction shown in FIG. 4). The alignment step is an operation for making the division lines 3 extending in the first direction parallel to the X direction and accordingly making the division lines 3 extending in the second direction parallel to the Y direction by suitably rotating the holding means 30. This alignment operation is performed by applying electromagnetic waves having a transmission wavelength to the wafer 1 from the camera 22 and detecting reflected light from the front side 1a of the wafer 1 to form an image.

(2-3) Laser Processing Step

Figure 5:
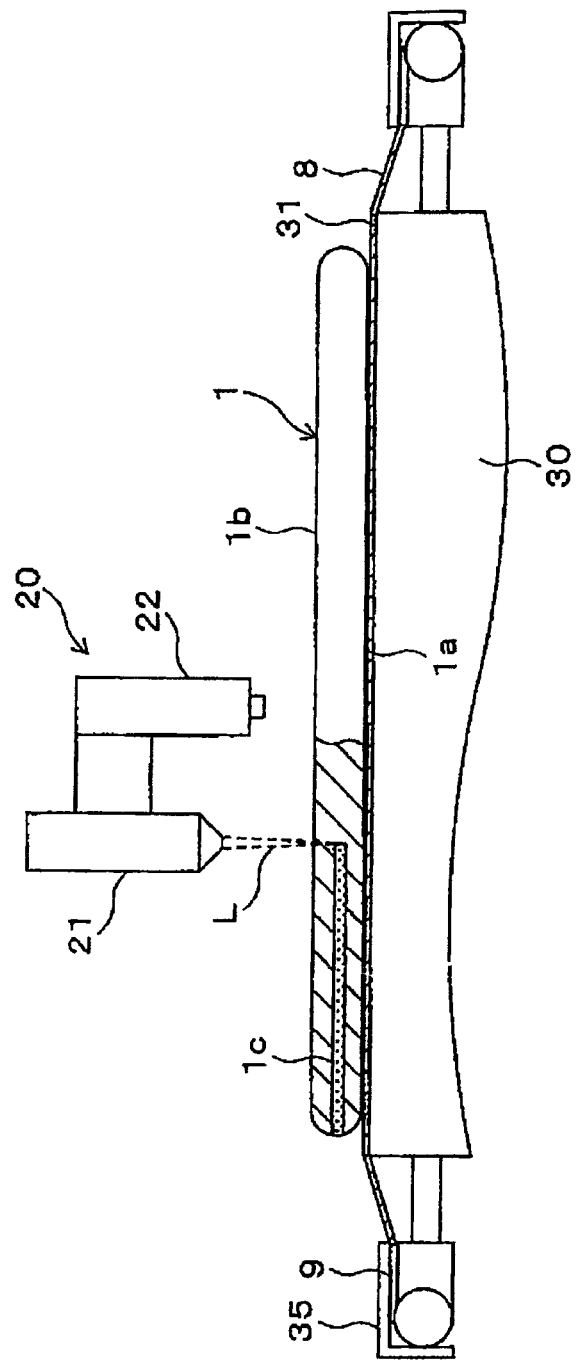
FIG. 5 is a partially sectional side view showing a laser processing step in the laser processing method.

As shown in FIG. 5, a laser processing step is performed in such a manner that a laser beam L is applied from the laser applying unit 21 of the laser processing means 20 to the back side 1b of the wafer 1 along each division line 3 in the condition where the focal point of the laser beam L is set inside the wafer 1, thereby forming a modified layer 1c inside the wafer 1 along each division line 3. The modified layer 1c has a strength smaller than that of the other regions in the wafer 1. The modified layer 1c extends parallel to the front and back sides of the wafer 1 and has a fixed thickness.

The modified layer 1c along each division line 3 is formed in the following manner. The reference line of the camera 22 is aligned with the division line 3 extending in the X direction at one end of the Y direction as viewed in FIG. 4 by indexing the wafer 1. Thereafter, the laser beam is applied along this division line 3 as feeding the wafer 1 in the X direction. Thereafter, the wafer 1 is indexed in the Y direction by a predetermined amount as the pitch of the division lines 3, and the wafer 1 is next fed in the X direction as applying the laser beam L along the next division line 3. In this manner, the indexing operation and the feeding operation are repeated and the laser beam L is applied along all of the division lines 3 extending in the X direction. After forming the modified layers 1c along all of the division lines 3 extending in the X direction, the holding means 30 is rotated 90° to make the other division lines 3 parallel to the X direction. Thereafter, the laser beam L is similarly applied along the other division lines 3 to thereby form the modified layers 1c along the other division lines 3.

Figure 6:
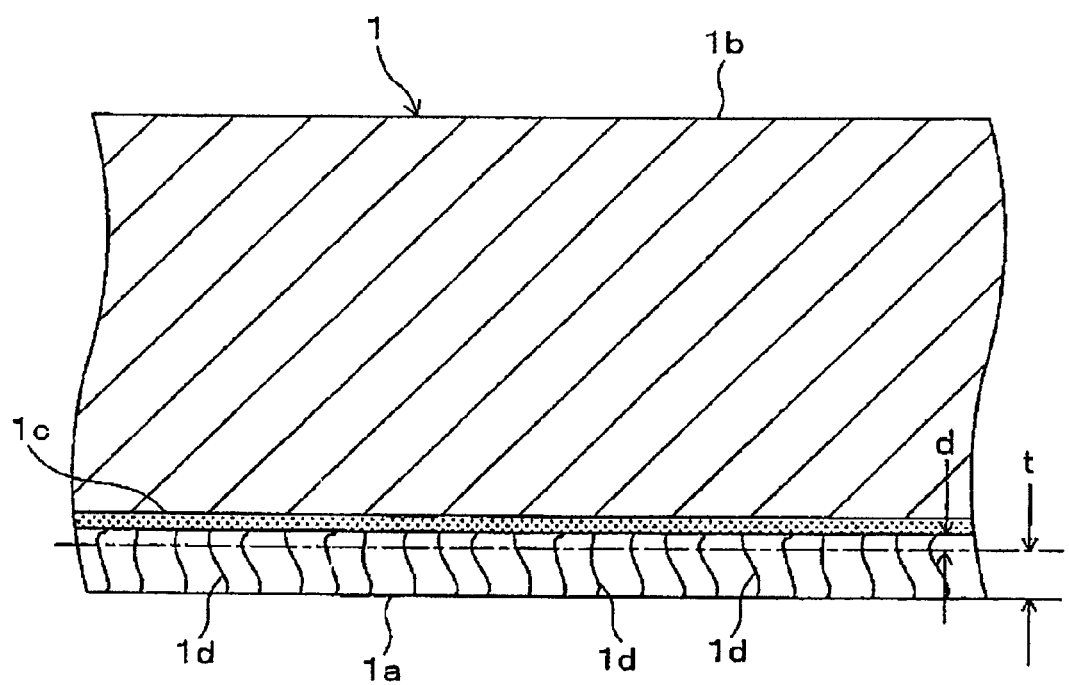
FIG. 6 is an enlarged sectional view showing a modified layer formed inside the wafer by the laser processing step.

As shown in FIG. 6, the focal point of the laser beam L for forming the modified layers 1c is set at a position higher than the finished thickness t (e.g., about 50 to 100 µm) of the wafer 1 by the distance d (e.g., about 5 to 20 µm) on the back side 1b, wherein the finished thickness t is obtained by grinding the back side 1b of the wafer 1 in a grinding step to be performed later. As shown in FIG. 6, in the laser processing step according to this preferred embodiment, cracks 1d are also formed so as to extend from each modified layer 1c to the front side 1a of the wafer 1.

(2-4) Positional Deviation Correcting Step

Figure 7:
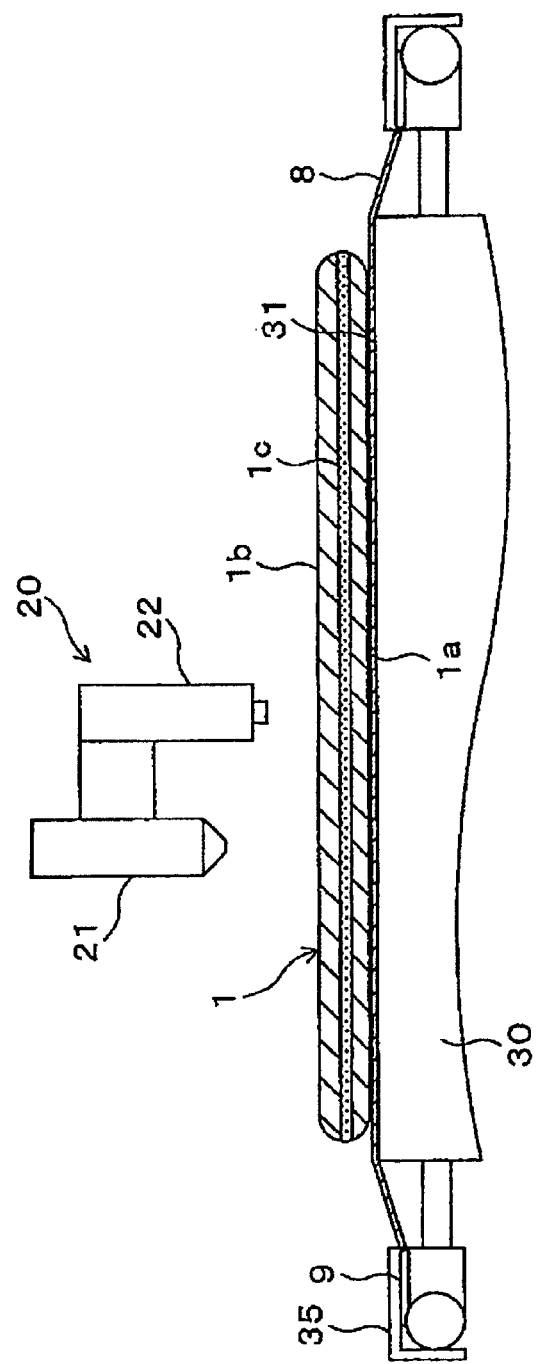
FIG. 7 is a partially sectional side view showing a positional deviation correcting step in the laser processing method.
Figure 8:
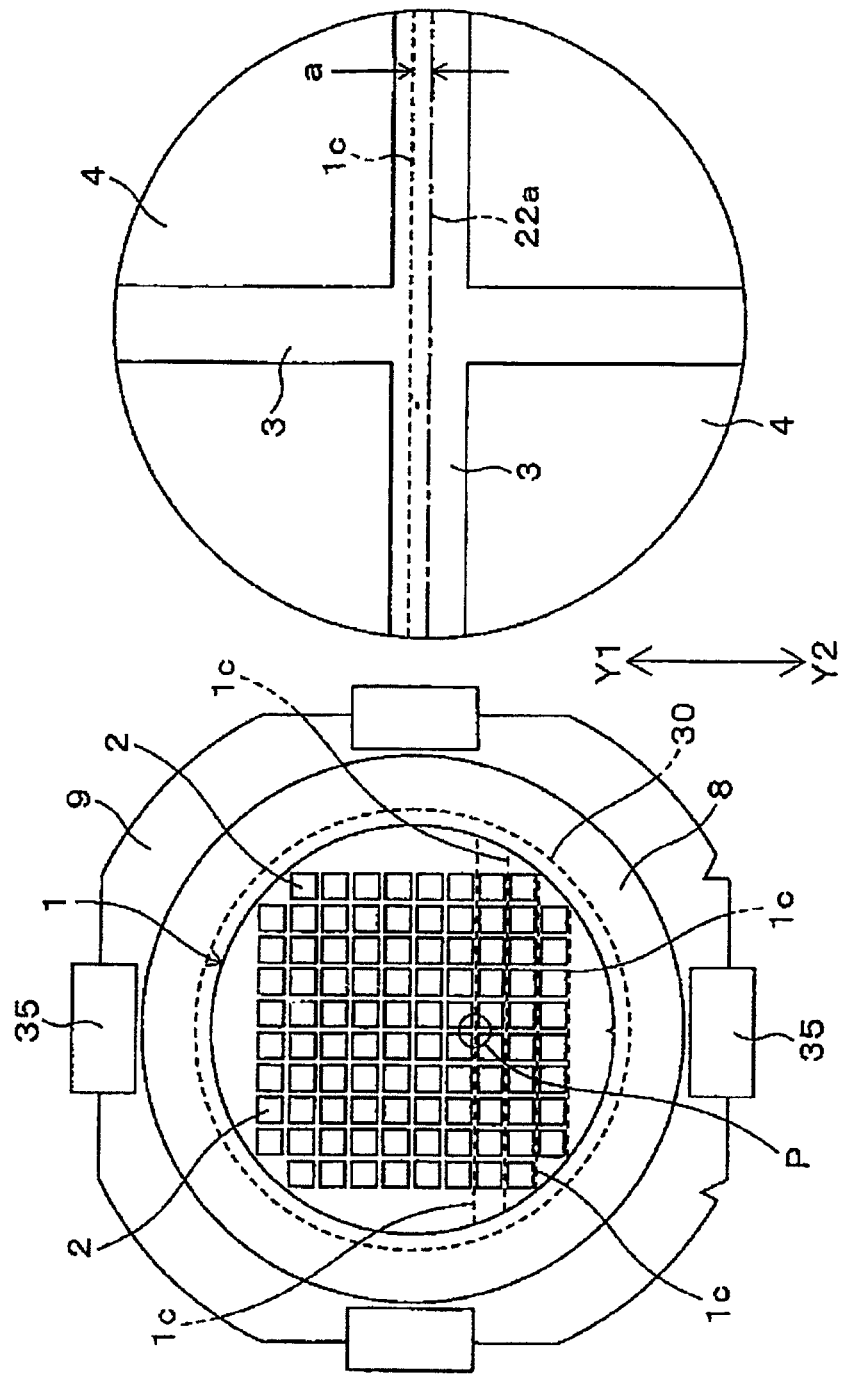
FIG. 8 is a plan view for illustrating the positional deviation correcting step.

A positional deviation correcting step is performed plural times with predetermined timing during the performance of the laser processing step mentioned above. As shown in FIG. 7, the positional deviation correcting step includes the steps of imaging a predetermined one of the modified layers 1c formed inside the wafer 1 from the back side 1b of the wafer 1 by using the camera 22, detecting the amount of positional deviation of this predetermined modified layer 1c from the reference line 22a of the camera 22 in the Y direction as shown in FIG. 8 to calculate a correction value for correcting this positional deviation, and adding this correction value to data on applied position of the laser beam L to thereby make the applied position of the laser beam L coincide with each division line 3.

The timing of the positional deviation correcting step is set so that the positional deviation correcting step is performed every time the formation of the modified layers 1c along five division lines 3, for example, is finished. The encircled portion on the right side in FIG. 8 shows an image obtained by using the camera 22 to detect an area P shown on the left side in FIG. 8. As shown in FIG. 8, the modified layer 1c formed inside the wafer 1 along the division line 3 extending in the X direction is deviated from the reference line 22a of the camera 22 in the Y1 direction by the distance a. In this case, the data on applied position of the laser beam L is corrected so that the applied position of the laser beam L is shifted in the Y2 direction by the distance a. In the case that the reference line 22a indexed is deviated from the center of the division line 3, the reference line 22a is preliminarily aligned with the division line 3 to thereby make the coincidence between the applied position of the laser beam L and the division line 3.

This positional deviation correcting step is performed in forming the modified layers 1c along both the division lines 3 extending in the first direction and the division lines 3 extending in the second direction. Further, the timing of the positional deviation correcting step is arbitrary in the present invention. However, the larger the number of times of repetition of this step, the smaller the amount of positional deviation.

(2-5) Grinding Step

Figure 9:
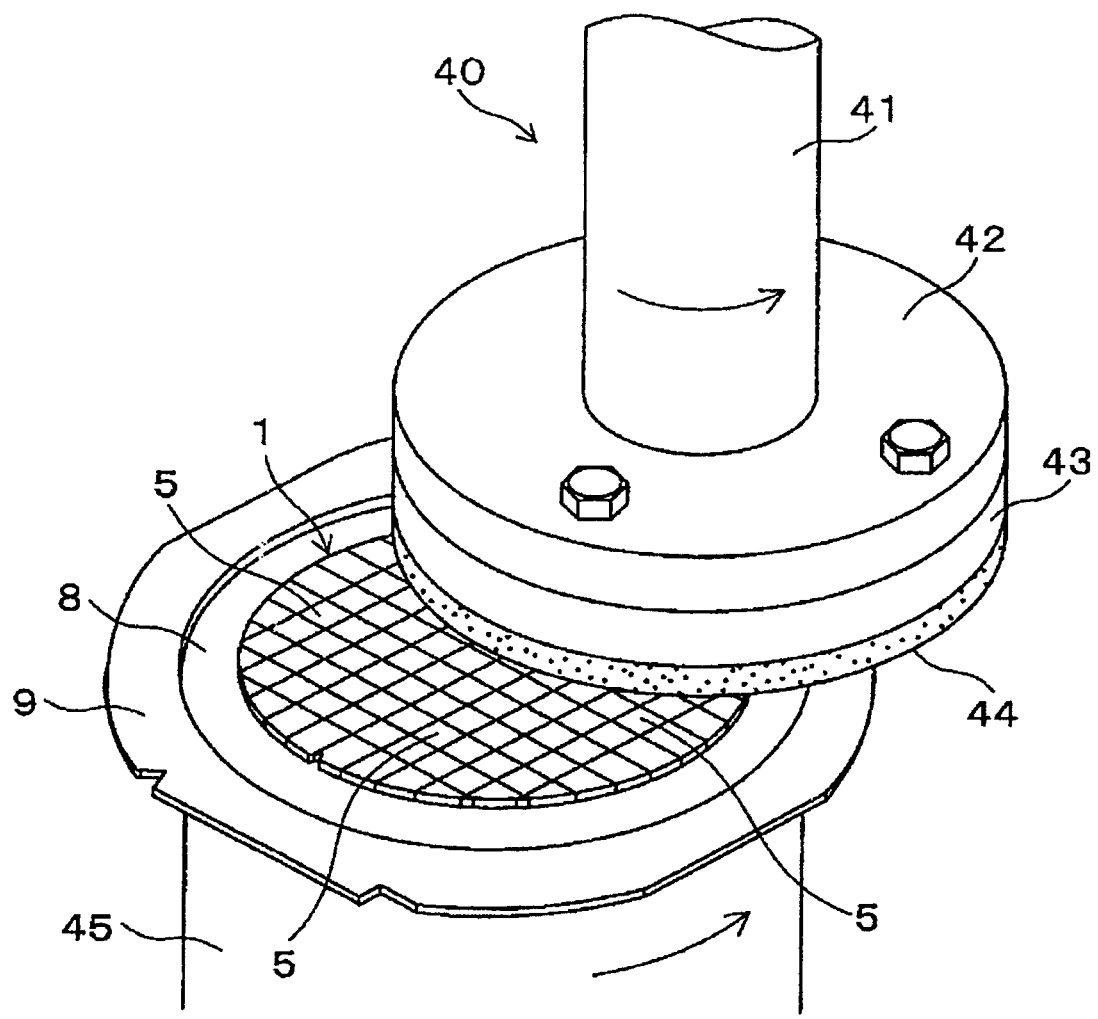
FIG. 9 is a perspective view showing a grinding step in the laser processing method.

After performing the laser processing step as performing the positional deviation correcting step to thereby form the modified layers 1c along all of the division lines 3, the wafer 1 is removed from the holding means 30. Thereafter, a grinding step is performed in such a manner that the back side 1b of the wafer 1 is ground to reduce the thickness of the wafer 1 to the finished thickness and at the same time the wafer 1 is divided along the modified layers 1c, or the division lines 3 into the regions 4 to obtain a plurality of individual chips 5 respectively corresponding to the plural devices 2 as shown in FIG. 9. More specifically, as shown in FIG. 9, the wafer 1 is held on a holding table 45 in the condition where the adhesive tape 8 attached to the front side 1a of the wafer 1 comes into contact with the holding table 45. Accordingly, the back side 1b of the wafer 1 held through the adhesive tape 8 on the holding table 45 is exposed, or oriented upward. In this condition, the back side 1b of the wafer 1 is ground by grinding means 40 to thereby reduce the thickness of the wafer 1 to the finished thickness.

The holding table 45 has a horizontal circular holding surface for holding the wafer 1 thereon under suction by a vacuum. The holding table 45 is rotatable about its axis by a rotational driving mechanism (not shown). The grinding means 40 includes a spindle 41 extending in a vertical direction and adapted to be rotationally driven by a motor (not shown), a flange 42 fixed to the lower end of the spindle 41, and a grinding wheel 43 fixed to the lower surface of the flange 42. The grinding means 40 is provided above the holding table 45 so as to be vertically movable. An annular abrasive member 44 is fixed to the lower surface of the grinding wheel 43 along the outer circumference thereof. The abrasive member 44 is suitably selected according to the material of the wafer 1. For example, the abrasive member 44 is provided by a diamond abrasive member formed by bonding diamond abrasive grains with a bond such as metal bond and resin bond.

The grinding step of grinding the back side 1b of the wafer 1 by using the grinding means 40 is performed in the following manner. In the condition where the wafer 1 is held under suction on the holding table 45, the holding table 45 is rotated in one direction at a predetermined speed, and the grinding wheel 43 is also rotated in the same direction as the direction of rotation of the holding table 45. In this rotational condition, the grinding means 40 is lowered to bring the abrasive member 44 fixed to the grinding wheel 43 into contact with the back side 1b of the wafer 1 and then fed downward to grind the entire surface of the back side 1b of the wafer 1. When the back side 1b of the wafer 1 is ground to reduce the thickness of the wafer 1 to the finished thickness t shown in FIG. 6, each modified layer 1c shown in FIG. 6 is removed and the layer in which the cracks 1d are formed is partially ground. This layer left on the front side 1a of the wafer 1 is divided along each division line 3 by the cracks 1d. Accordingly, when this layer in which the cracks 1d are formed is partially ground, the wafer 1 is divided into the individual chips 5. In another respect, an external force due to this grinding is applied to the wafer 1. Accordingly, there is also a case that the wafer 1 is divided into the chips 5 from each modified layer 1c as a break start point before each modified layer 1c is removed. In this case, the wafer 1 is ground to the finished thickness in the condition where it has already been divided into the chips 5.

(3) Effects of this Preferred Embodiment

According to this preferred embodiment, a positional deviation of each modified layer 1c from the corresponding division line 3 is sequentially detected with predetermined timing during the performance of the laser processing step of forming the modified layers 1c inside the wafer 1. A correction value is calculated according to the result of this detection and this correction value calculated is then added to the data on applied position of the laser beam L. Accordingly, after performing this positional deviation correcting step, the applied position of the laser beam L can be made to coincide with each division line 3. Thus, the deviation of the laser applied position can be reduced. Further, all of the modified layers 1c are removed by the grinding step of grinding the back side 1b of the wafer 1 to divide the wafer 1 into the chips 5. Accordingly, the modified layers 1c are not left on each chip 5, so that the die strength of each chip 5 can be improved as compared with the case where the modified layers 1c are left on each chip 5.

(4) Modification

Figure 10:
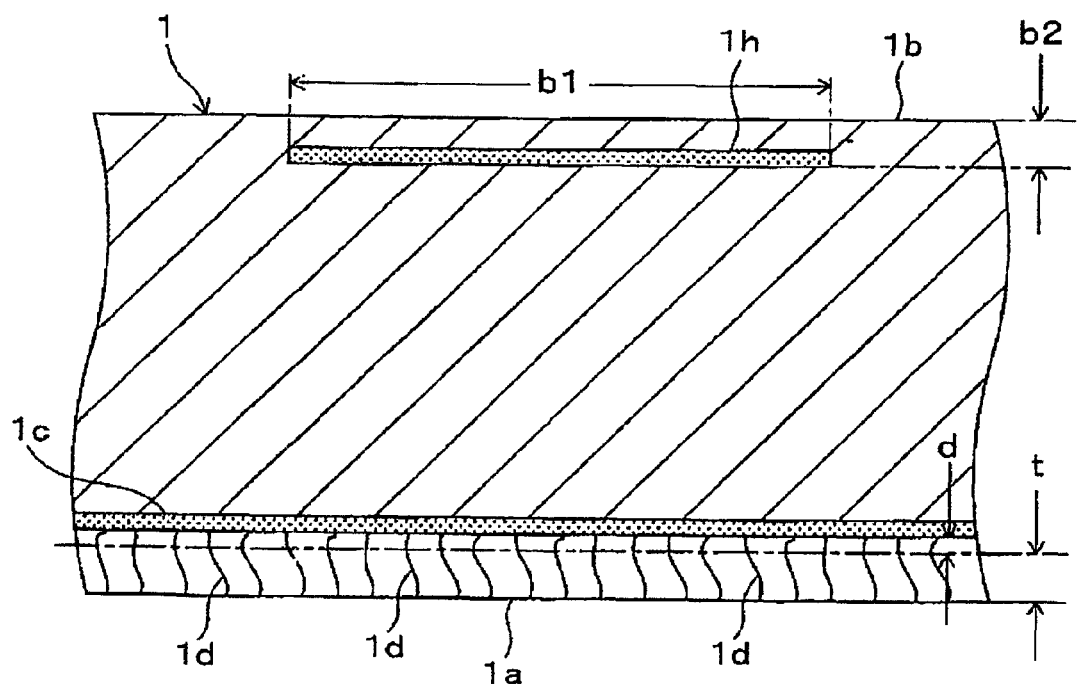
FIG. 10 is an enlarged sectional view for illustrating a modification of the positional deviation correcting step.

FIG. 10 is a sectional view showing a modification of the positional deviation correcting step according to this preferred embodiment. In this modification, a correcting modified layer 1h is locally formed inside the wafer 1 near the back side 1b of the wafer 1 along a predetermined one of the division lines 3 where the corresponding modified layer 1c has been formed. Thereafter, each correcting modified layer 1h formed in the wafer 1 is imaged by the camera 22, and the amount of positional deviation of each correcting modified layer 1h from the corresponding division line 3 is detected. Thereafter, a correction value for correcting this positional deviation is calculated from the amount of positional deviation detected above, and this correction value is added to the data on applied position of the laser beam L to thereby make the applied position of the laser beam L coincide with each division line 3. The formation of each correcting modified layer 1h is performed with the predetermined timing of the positional deviation correction. For example, the length b1 of each correcting modified layer 1h is set to about 10 mm, and the depth of each correcting modified layer 1h from the back side 1b of the wafer 1 is set to 100 to 200 μm.

In this modification, each correcting modified layer 1h is formed as an index for detection of the positional deviation of each regular modified layer 1c from the corresponding division line 3. Each correcting modified layer 1h is formed at a vertical position near the back side 1b of the wafer 1 above the corresponding regular modified layer 1c. Accordingly, an image of each correcting modified layer 1h by the camera 22, or an image by electromagnetic waves reflected by each correcting modified layer 1h can be obtained more clearly. As a result, the laser applied position can be aligned with each division line 3 more accurately. The length of each correcting modified layer 1h is set so that the positional deviation from the corresponding division line 3 can be detected. However, by minimizing the length of each correcting modified layer 1h, a reduction in strength of the wafer 1 can be suppressed.

If each correcting modified layer 1h is formed near the back side 1b of the wafer 1 before forming the corresponding regular modified layer 1c near the front side 1a of the wafer 1 along the same division line 3, there is a possibility that the laser beam L for forming the regular modified layer 1c may be blocked by the correcting modified layer 1h, so that the regular modified layer 1c may not be formed. To the contrary, according to this modification, the correcting modified layer 1h is formed after forming the regular modified layer 1c, so that the regular modified layer 1c can be reliably formed. As similar to the above preferred embodiment, a grinding step is next performed to grind the back side 1b of the wafer 1 to divide the wafer 1 into the individual chips 5. By performing the grinding step, all of the correcting modified layers 1h and all of the regular modified layers 1c are removed, so that these modified layers 1c and 1h are not left on each chip 5. As a result, the die strength of each chip 5 can be improved as compared with the case where the modified layers 1c and 1h are left on each chip 5.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing method of performing laser processing to a workpiece having a plurality of devices respectively formed in a plurality of regions partitioned by a plurality of crossing process lines formed on a front side of said workpiece, said laser processing method comprising:
   a holding step of holding the front side of said workpiece by using holding means to expose a back side of said workpiece;
   an alignment step of detecting said process lines from the back side of said workpiece held by said holding means to align each process line with a laser beam having a transmission wavelength to said workpiece;
   a laser processing step of applying said laser beam to said workpiece from the back side thereof along each process line in the condition where the focal point of said laser beam is set inside said workpiece after performing said alignment step, thereby forming a plurality of modified layers inside said workpiece respectively along said plurality of process lines; and
   a positional deviation correcting step of imaging a predetermined one of said modified layers formed inside said workpiece from the back side of said workpiece with predetermined timing by using imaging means during the performance of said laser processing step, detecting a positional deviation of said predetermined modified layer from a corresponding reference line of the imaging means to calculate a correction value, and adding said correction value to data on applied position of said laser beam to thereby make the applied position of said laser beam coincide with each process line.

2. The laser processing method according to claim 1, wherein said imaging means comprises a camera.

3. The laser processing method according to claim 1, wherein the reference line of the imaging means is aligned with one of said process lines of said workpiece.

4. The laser processing method according to claim 1, wherein said positional deviation correcting step is performed between performing said laser processing step upon one of said process lines and performing said laser processing step upon an adjacent one of said process lines.

5. The laser processing method according to claim 4, wherein said positional deviation correcting step is performed only once for every five process lines.

6. The laser processing method according to claim 1, wherein said imaging means is positioned upstream of a laser applying unit used for said laser processing step.

7. A laser processing method of performing laser processing to a workpiece having a plurality of devices respectively formed in a plurality of regions partitioned by a plurality of crossing process lines formed on a front side of said workpiece, said laser processing method comprising:
- a holding step of front side of said workpiece by using holding means to expose a back side of said workpiece;
- an alignment step of detecting said process lines from the back side of said workpiece held by said holding means to align each process line with a laser beam having a transmission wavelength to said workpiece;
- a laser processing step of applying said laser beam to said workpiece from the back side thereof along each process line in the condition where the focal point of said laser beam is set inside said workpiece after performing said alignment step, thereby forming a plurality of modified layers inside said workpiece respectively along said plurality of process lines; and
- a positional deviation correcting step of imaging a predetermined one of said modified layers formed inside said workpiece from the back side of said workpiece with predetermined timing by using imaging means during the performance of said laser processing step, detecting a positional deviation of said predetermined modified layer from the corresponding process line to calculate a correction value, and adding said correction value to data on a applied position of said laser beam to thereby make the applied position of said laser beam coincide with each process line, wherein each modified layer is formed at a predetermined height from the front side of said workpiece in said laser processing step; and said positional deviation correcting step includes the steps of applying said laser beam along said predetermined modified layer to thereby form a correcting modified layer near the back side of said workpiece at a level higher than said predetermined height, imaging said correcting modified layer by using said imaging means, and detecting a positional deviation of said correcting modified layer from the corresponding process line to calculate said correction value.

8. The laser processing method according to claim 7, wherein said correcting modified layer is locally formed so as to have a predetermined length along the corresponding process line.

9. The laser processing method according to claim 7, wherein said predetermined height of each modified layer is greater than a finished thickness of said workpiece from the front side thereof;
- cracks are formed along each modified layer so as to extend from each modified layer to the front side of said workpiece; and
- said laser processing method further comprises a grinding step of grinding the back side of said workpiece to reduce the thickness of said workpiece to said finished thickness after performing said laser processing step, thereby dividing said workpiece along each process line to obtain individual chips.

* * * * *